(12) United States Patent
Akkaraju et al.

(10) Patent No.: US 12,001,770 B2
(45) Date of Patent: Jun. 4, 2024

(54) ANALOG CENTRIC CURRENT MODELING WITHIN A DIGITAL TESTBENCH IN MIXED-SIGNAL VERIFICATION

(71) Applicant: Synopsys, Inc., Mountain View, CA (US)

(72) Inventors: Vijay Akkaraju, San Francisco, CA (US); David Francis Cronauer, Beaverton, OR (US)

(73) Assignee: Synopsys, Inc., Sunnyvale, CA (US)

( * ) Notice: Subject to any disclaimer, the term of this patent is extended or adjusted under 35 U.S.C. 154(b) by 717 days.

(21) Appl. No.: 15/658,308

(22) Filed: Jul. 24, 2017

(65) Prior Publication Data

US 2018/0129767 A1 May 10, 2018

Related U.S. Application Data

(60) Provisional application No. 62/341,558, filed on May 25, 2016.

(51) Int. Cl.
*G06F 30/367* (2020.01)
*G06F 30/33* (2020.01)
(Continued)

(52) U.S. Cl.
CPC ............ *G06F 30/367* (2020.01); *G06F 30/33* (2020.01); *G06F 30/3308* (2020.01); *G06F 30/3312* (2020.01); *G06F 30/38* (2020.01)

(58) Field of Classification Search
CPC .... G06F 30/367; G06F 30/3312; G06F 30/33; G06F 30/3323; G06F 2111/04; G06F 2111/20; G06F 30/38; G06F 30/3308
(Continued)

(56) References Cited

U.S. PATENT DOCUMENTS 5,481,484 A * 1/1996 Ogawa ................... G06F 30/33
703/14
5,905,883 A * 5/1999 Kasuya .................. G06F 30/33
719/310
(Continued)

FOREIGN PATENT DOCUMENTS

CN 105408829 A * 3/2016 ............. G05F 1/465
JP 2004096889 A * 3/2004

OTHER PUBLICATIONS

De Lima, Jader A., and Wallace A. Pimenta. "An accurate sense-fet current limiter with embedded softstart for linear dc/dc converters." 2011 IEEE International Symposium of Circuits and Systems (ISCAS). IEEE, 2011. (Year: 2011).*

(Continued)

*Primary Examiner* — Boris Gorney
*Assistant Examiner* — David A Hopkins
(74) *Attorney, Agent, or Firm* — Weaver Austin Villeneuve & Sampson LLP

(57) ABSTRACT

A method includes operating a digital simulator to mimic loading effects of digital circuit blocks of a circuit design on analog circuit blocks of the circuit design. The digital simulator sets a current signal timing and a current level value at an analog/digital boundary between the digital circuit aspects and the analog circuit aspects. The analog simulator is operated to apply the current signal timing and the current level value to simulate the analog circuit blocks.

10 Claims, 6 Drawing Sheets

(51) Int. Cl.
- G06F 30/3308 (2020.01)
- G06F 30/3312 (2020.01)
- G06F 30/38 (2020.01)

(58) Field of Classification Search
USPC .......................................................... 703/14
See application file for complete search history.

(56) References Cited

U.S. PATENT DOCUMENTS

| | | | | |
|---|---|---|---|---|
| 7,761,279 | B1* | 7/2010 | Cai | G06F 30/367 |
| | | | | 703/16 |
| 8,195,439 | B1* | 6/2012 | Hussain | G06F 30/367 |
| | | | | 703/14 |
| 8,201,137 | B1* | 6/2012 | Bhushan | G06F 30/367 |
| | | | | 716/132 |
| 8,296,699 | B1* | 10/2012 | Chetput | G06F 30/367 |
| | | | | 716/106 |
| 8,452,582 | B1* | 5/2013 | Al-Hawari | G06F 30/367 |
| | | | | 703/13 |
| 8,521,483 | B1* | 8/2013 | Kukal | G06F 30/33 |
| | | | | 703/2 |
| 9,703,921 | B1* | 7/2017 | Lin | G06F 30/33 |
| 10,210,294 | B1* | 2/2019 | Corbett | G06F 30/33 |
| 2002/0040465 | A1* | 4/2002 | Kimura | G06F 30/367 |
| | | | | 716/112 |
| 2002/0049577 | A1* | 4/2002 | Scherr | G06F 30/367 |
| | | | | 703/14 |
| 2007/0216383 | A1* | 9/2007 | Al-Shyoukh | G05F 1/468 |
| | | | | 323/280 |
| 2008/0115028 | A1* | 5/2008 | Homer | G01R 31/318357 |
| | | | | 714/741 |
| 2009/0222253 | A1* | 9/2009 | Sheffler | G06F 30/33 |
| | | | | 703/16 |
| 2013/0275936 | A1* | 10/2013 | Abhishek | G06F 30/367 |
| | | | | 716/113 |
| 2013/0338991 | A1* | 12/2013 | Lin | G06F 30/367 |
| | | | | 703/14 |
| 2015/0177757 | A1* | 6/2015 | Bhattad | G05F 1/575 |
| | | | | 323/281 |
| 2015/0229155 | A1* | 8/2015 | Sporck | H02J 7/0091 |
| | | | | 320/107 |
| 2016/0048147 | A1* | 2/2016 | Abhishek | G05F 1/468 |
| | | | | 323/313 |

OTHER PUBLICATIONS

Al-Shyoukh, Mohammad, and Hoi Lee. "A current-limiter-based soft-start scheme for linear and low-dropout voltage regulators." Proceedings of 2010 IEEE International Symposium on Circuits and Systems. IEEE, 2010. (Year: 2010).*

Chu, Yen-Chia, and Le-Ren Chang-Chien. "Digitally controlled low-dropout regulator with fast-transient and autotuning algorithms." IEEE transactions on power electronics 28.9 (2012): 4308-4317. (Year: 2012).*

Alico, Jurgen, and Aleksandar Prodic. "Multiphase optimal response mixed-signal current-programmed mode controller." 2010 Twenty-Fifth Annual IEEE Applied Power Electronics Conference and Exposition (APEC). IEEE, 2010. (Year: 2010).*

Bonomi, Daniele, et al. "Effects of digital switching noise on analog voltage references in mixed-signal CMOS ICs." Proceedings of the 19th annual symposium on Integrated circuits and systems design. 2006. (Year: 2006).*

Das, "Exploration of Real Value Modelling for Complex Mixed Signal Verification", 2015, Master's Thesis, Indraprastha Institute of Information Technology, New Delhi, (Year: 2015).*

Jackum, Thomas, et al. "A digitally controlled linear voltage regulator in a 65nm CMOS process." 2010 17th IEEE International Conference on Electronics, Circuits and Systems. IEEE, 2010. (Year: 2010).*

Miyama, Mikako, et al. "An efficient logic/circuit mixed-mode simulator for analysis of power supply voltage fluctuation." Proceedings of ASP-DAC'95/CHDL'95/VLSI'95 with EDA Technofair. IEEE, 1995. (Year: 1995).*

Popescu, Gabriel, and Leonid B. Goldgeisser. "Mixed signal aspects of behavioral modeling and simulation." 2004 IEEE International Symposium on Circuits and Systems (IEEE Cat. No. 04CH37512). vol. 5. IEEE, 2004. (Year: 2004).*

Saggini, Stefano, et al. "A mixed-signal synchronous/asynchronous control for high-frequency dc-dc boost converters." IEEE Transactions on Industrial Electronics 55.5 (2008): 2053-2060. (Year: 2008).*

Turley, "Get Wreal", Article from EE Journal, May 2, 2011, URL: www(dot)eejournal(dot)com/2011/05/02/get-wreal/ (Year: 2011).*

Zuberek, W. M. "Milxed-mode simulation with spice-like circuit simulators." Twenty-Third Asilomar Conference on Signals, Systems and Computers, 1989 . . . vol. 1. IEEE. (Year: 1989).*

Synopsys, "What is Circuit Simulation?", Glossary accessed via URL Synopsys(dot)com on Sep. 6, 2022 (Year: 2022).*

Lam et al., Hardware Design Verification: Simulation and Formal Method-Based Approaches, 2005, ISBN: 0-13-143347-4 (Year: 2005).*

Balasubramanian et al., "Solutions for Mixed-Signal SoC Verification Using Real Number Models", 2013, Cadence Whitepaper, URL: www(dot)cadence(dot)com/content/dam/cadence-www/global/en_US/documents/solutions/mixed-signal-verification-wp(dot)pdf(Year: 2013).*

Lee, "Understanding the Terms and Definitions of LDO Voltage Regulators", Oct. 1999, Texas Instruments, SLVA079, URL: www(dot)ti(dot)com/lit/pdf/slva079 (Year: 1999).*

Massachusetts Institute of Technology, "Lecture 8 MOSFET(I) MOSFET I-V Characteristics", Spring 2007, Lecture Notes from MIT, URL: web(dot)mit(dot)edu/6(dot)012/www/SP07-L8(dot)pdf (Year: 2007).*

Sharma, Vipin, et al. "Predicting the correlation between analog behavioral models and spice circuits for robust soc verification." 2008 IEEE International Behavioral Modeling and Simulation Workshop. IEEE, 2008 (Year: 2008).*

Wegener, Carsten. "Method of modeling analog circuits in verilog for mixed-signal design simulations." 2013 European Conference on Circuit Theory and Design (ECCTD). IEEE, 2013., (Year: 2013).*

Knoth, Christoph, Hela Jedda, and Ulf Schlichtmann. "Current source modeling for power and timing analysis at different supply voltages." 2012 Design, Automation & Test in Europe Conference & Exhibition (DATE). IEEE, 2012. See the abstract and §§ II-III (Year: 2012).*

Speicher, Fabian, et al. "Ams verification methodology regarding supply modulation in rf socs induced by digital standard cells." 2018 Design, Automation & Test in Europe Conference & Exhibition (DATE). IEEE, 2018. See the abstract, and §§ I-III (Year: 2018).*

\* cited by examiner

ANALOG CENTRIC CURRENT MODELING WITHIN A DIGITAL TESTBENCH IN MIXED-SIGNAL VERIFICATION

CROSS REFERENCE TO RELATED APPLICATIONS

The present application claims benefit under 35 USC 119(e) of Application Ser. No. 62/341,558, filed May 5, 2016, the contents of which is incorporated herein by reference in their entirety.

TECHNICAL FIELD

The present application relates generally to testing a circuit design, and more specifically to testing such a circuit design using a mixed mode analog-digital simulation/testing design tool.

BACKGROUND

A circuit design may be simulated by operating two system components. One component simulates digital circuit aspects of the circuit design, and another component simulates analog circuit aspects of the circuit design. Signals in the digital circuit aspects have a value of either "1" (i.e. signal is "on") or "0" (i.e. signal is "off"). In the analog circuit aspects the signals may have a continuous range of numerical values including floating point values (e.g., 1.5 or 6.2).

A mixed-signal circuit design may be split into digital circuit aspects and analog circuit aspects each allocated respectively to the digital simulator and to the analog simulator. The digital circuit aspects simulate faster than the analog circuit aspects, therefore as many circuit aspects as practically possible are typically allocated to the digital simulator. The analog circuit aspects simulate more accurately than the digital circuit aspects as the analog simulator simulates with continuous values. At the analog/digital boundary between the analog circuit aspects and the digital circuit aspects, boundary voltages are monitored and values of the boundary voltages are sent as digital representations, either logic '1' or '0'. At the analog/digital boundary, there is no current loading of the digital circuit aspects. Due to this lack of current loading, simulation results may be incorrect as the voltages of the analog circuit aspects will not properly charge nor discharge in the simulation. These errors may show as timing or level errors.

BRIEF SUMMARY

Improvements are disclosed for simulation of a mixed-signal circuit design (a circuit combining analog and digital circuit aspects). One improvement utilizes current loading at the analog/digital boundary in the mixed-signal circuit design; the other is a technique to more accurately measure and model leakage current. Each improvement facilitates lossless propagation of current signals in either direction: digital-to-analog and analog-to-digital.

One disclosed technique helps ensure that changes to current properties on the digital side of the analog/digital boundary are directly reflected to current nodes on the analog side of the analog/digital boundary, doing away with the "markers" utilized in prior approaches. In this way, approximations of the current properties by the analog simulator are avoided. The analog simulator applies the exact current properties provided from the digital side to its simulation of the analog circuit aspects of the mixed-signal circuit design. The analog simulator then communicates results of simulating the analog circuit aspects using the current properties provided by the digital simulator back to the digital simulator.

This enables accurate modeling of current load features found in most analog circuits. The digital simulator drives to the analog simulator a specific current level value at a specific time of circuit simulation, and then increases or decreases (ramps) the current level value at a rate that is also controlled from the analog simulator.

The measured current signal values on the analog side of the analog/digital boundary in a mixed-signal circuit design are communicated to the digital side of the analog/digital boundary. This enables an accurate gauging of leakage current in the circuit design. Accurate measurement of leakage current is important to prevent mistakes in the circuit behavior.

In one aspect, a method includes operating a digital simulator to mimic loading effects of digital circuit aspects of a circuit design on analog circuit aspects of the circuit design. A current signal timing and a current level value are set at an analog/digital boundary between the digital circuit aspects and the analog circuit aspects. An analog simulator is operated to apply the current signal timing and the current level value to simulate the analog circuit aspects.

In another aspect, a method of simulating a circuit design includes applying changes to current properties of current signals in digital circuit aspects in a digital simulator to current nodes of analog circuit aspects in an analog simulator. The analog simulator is operated to apply the current properties from the digital simulator for simulation of the current signals in the analog circuit aspects, and to communicate results of simulating the current properties to the analog circuit aspects in the analog simulator back to a simulation of the digital circuit aspects of the circuit design by the digital simulator.

In yet another aspect, a circuit design simulator includes a digital simulator and an analog simulator. The digital simulator includes digital circuit aspects and a leakage current simulator, and the analog simulator includes analog circuit aspects and a measurement module to measure simulated current properties of the analog circuit aspects to generate measured current signal values. A bridge is operable to communicate a current signal timing, a current level value, and a current rate of change from the digital circuit aspects to the analog circuit aspects, and the measurement module is operable to communicate the measured current signal values to the leakage current simulator.

DETAILED DESCRIPTION

Figure 1:
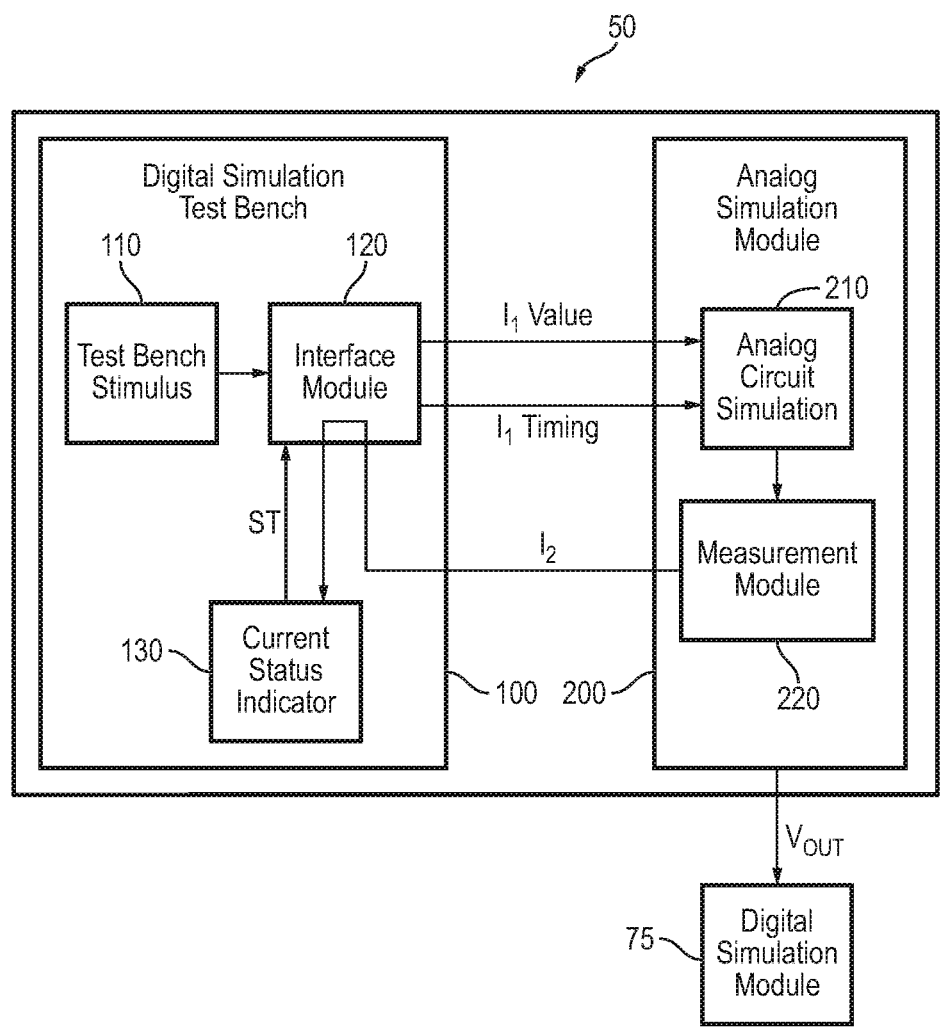
FIG. 1 is a simplified high-level bock diagram of a mixed-mode circuit design simulator, in accordance with one embodiment of the present invention.

Where used, the term "CHL" refers to 'configurable hardware logic', electronic hardware having physical interconnections that can be re-configured over and over for particular purposes. Circuit boards including multiple FPGAs are one example of CHL.

Where used, the term "FPGA" refers to 'field programmable gate array', a type of CHL including logic blocks that can be re-wired in the field (after manufacturing). An FPGA configuration is generally specified using a hardware description language (HDL). FPGAs contain an array of programmable logic blocks, and a hierarchy of reconfigurable interconnects that allow the blocks to be electrically interconnected into different configurations. Logic blocks can be interconnected to perform complex combinational functions. In many FPGAs, logic blocks also include memory elements, which may be simple flip-flops or more complete blocks of memory.

Where used, the term "HDL" refers to 'hardware description language', a specialized computer language used to describe the structure and behavior of electronic circuits. HDL enables a precise, formal description of an electronic circuit that allows for the automated analysis and simulation of an electronic circuit. It also allows for the synthesis of a HDL description into a netlist (a specification of physical electronic components and how they are connected together), which can then be placed and routed to define an integrated circuit.

Where used, the term "Programmable device" refers to an integrated circuit designed to be configured and/or reconfigured after manufacturing. Programmable devices may include programmable processors, such as field programmable gate arrays (FPGAs) and/or any other type programmable devices. Configuration of the programmable device is specified using computer code, such as a hardware description language (HDL), for example Verilog, VHDL, or the like. A programmable device may include an array of programmable logic blocks and a hierarchy of re-configurable interconnects that enable the programmable logic blocks to be coupled to each other according to the descriptions in the HDL code. Each of the programmable logic blocks can be configured to perform complex combinational functions, or simple logic gates, such as AND and XOR logic blocks. In most FPGAs, logic blocks also include memory elements, which may be simple latches, flip-flops, i.e. "flops," or more complex blocks of memory. Depending on the length of the interconnections between different logic blocks, signals may arrive at input terminals of the logic blocks at different times.

Where used, the term "VLSI" refers to 'very large scale integration', a single circuit chip package including, typically, hundreds of thousands, millions, or even billions of individual circuits.

To benefit from the relatively fast simulation speed of the digital simulator, embodiments of the present invention enable complex analog effects of the current signals to be controlled from the digital simulator.

Changes to current properties of the digital simulator are abstracted to current nodes of the analog simulator. To achieve this, the analog simulator applies the current supplied from the digital simulator to simulate behavior of the analog circuit aspects, and in response, sends the simulation results back to the digital simulator to be applied on the digital circuit aspects of the mixed-signal circuit design.

Embodiments of the present invention enable accurate modeling of the current load characteristics that are utilized by analog circuits. In accordance with one embodiment of the present invention, the value of the current signal at each of different simulations times is provided from the digital simulator to the analog simulator. Control of the current supplied to the analog simulator from the digital simulator enables accurate timing of the digital control signals that are utilized during a power up cycle and a power down cycle of the analog circuit aspects.

Current signal propagation from the digital simulator to the analog simulator (i.e., the handshake protocol) in accordance with embodiments of the present invention, is achieved through an interface disposed between the digital simulator and the analog simulator. The interface supplies the following information to the digital simulator: i) the location (destination) within the analog circuit aspects of the design where the current is applied, ii) the numerical values of the signal (the current level), and iii) the time associated with each of the values of the current signal.

The current properties are subsequently measured in the analog simulator and fed back to the digital simulator. The feed-back enables the digital simulator to accurately gauge the leakage current of the analog circuit aspects when the current signal remains active within the analog circuit aspects, even though the circuit design or at the analog circuit aspects of the circuit design is turned off. Such measurements, in accordance with another aspect of the present invention, reduce errors of the simulated results.

FIG. 1 is a simplified high-level bock diagram of a mixed-mode circuit design simulator 50, in accordance with one embodiment of the present invention. Simulator 50 is shown as including, in part, a digital simulation module 50, a digital simulation test bench 100, and an analog simulation module 200. Digital simulation test bench 100 is shown as including, in part, a test bench stimulus 110, an interface module 120, and a current status indicator 130. Analog simulation module 200 is shown as including, in part, an analog circuit simulator 210, and a current measurement module 220.

Test bench stimulus 110 applies a test vector to interface module 120, in response to which interface module 120 supplies a current signal to analog circuit simulator 210.

When simulating events that cause a change in the voltage level supplied to various circuit blocks of a design (e.g., power-up or power-down operations), the current signal supplied to the analog simulation module 210 has a transient behavior and thus has different values at different times. Accordingly, to simulate such events, interface module 120 provides a multitude of current signal values at different simulation times. Analog circuit simulator 210 receives the time-varying current signal $I_1$ from interface 120 and applies the current signal to the target analog circuit blocks to perform the analog simulation.

Measurement module 220 is adapted to measure a current $I_2$ generated by the analog circuit blocks—in response to the transient current signal supplied by interface module 120—and deliver the measured current $I_2$ to current status indicator 130 via interface module 120. If current signal $I_2$ is detected as exceeding a threshold value, signal ST, supplied by current status indicator 130 to interface module 120, causes interface module 120 to change the values of current $I_1$. This process is repeated until current $I_2$ is detected to be equal to or less than the threshold value.

Analog simulation module 200 is further adapted to provide one or more supply voltages $V_{out}$ to the digital simulation module which simulates the behavior of the digital blocks disposed in the circuit design. In accordance with embodiments of the present invention, supply voltage $V_{out}$ has a substantially improved timing characteristic and a transient behavior that mimics the behavior of actual fabricated circuits.

Figure 2:
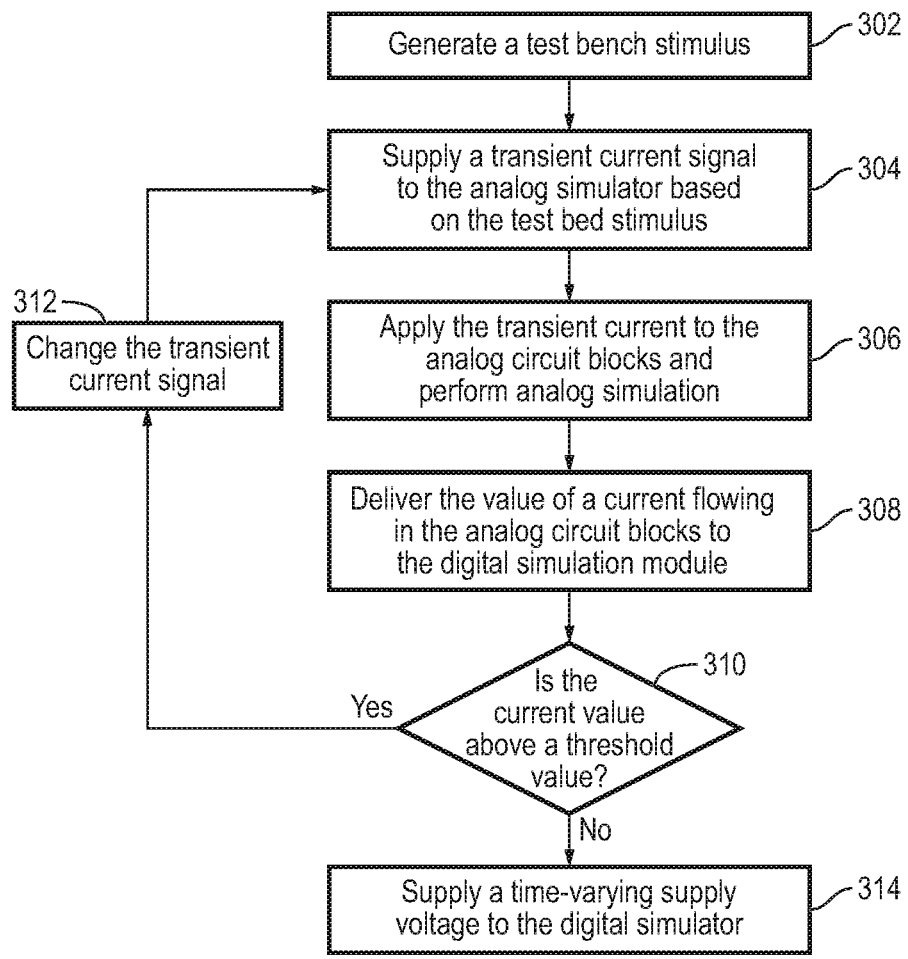
FIG. 2 is a flowchart for performing mixed-mode simulation of a circuit design, in accordance with one embodiment of the present invention.

FIG. 2 is a flowchart 300 for performing mixed-mode simulation of a circuit design, in accordance with one embodiment of the present invention. At 302 a test bench stimulus is generated. At 304, a transient current is supplied to the analog simulator based on the test bench stimulus. The value of the current signal at each of a multitude of times are supplied to enable construction of the transient behavior at the analog simulator.

At 306, the transient current signal is applied to the analog circuit blocks to perform the analog simulation. At 308, the value of a current signal generated as a result of the analog simulation is supplied to the digital simulation module. If the current value supplied to the digital simulation module is detected at 310 to be equal to or less than a threshold value, a time varying supply voltage having a value defined by the current value is supplied at 312 to the digital simulator. If the current value supplied to the digital simulation module is detected at 310 to be greater than the threshold value, the value of the transient current is changed at 312 and supplied to the analog simulation module 34. The process is repeated until the current measured by the analog simulation module falls within the acceptable range defined by the threshold.

Figure 3:
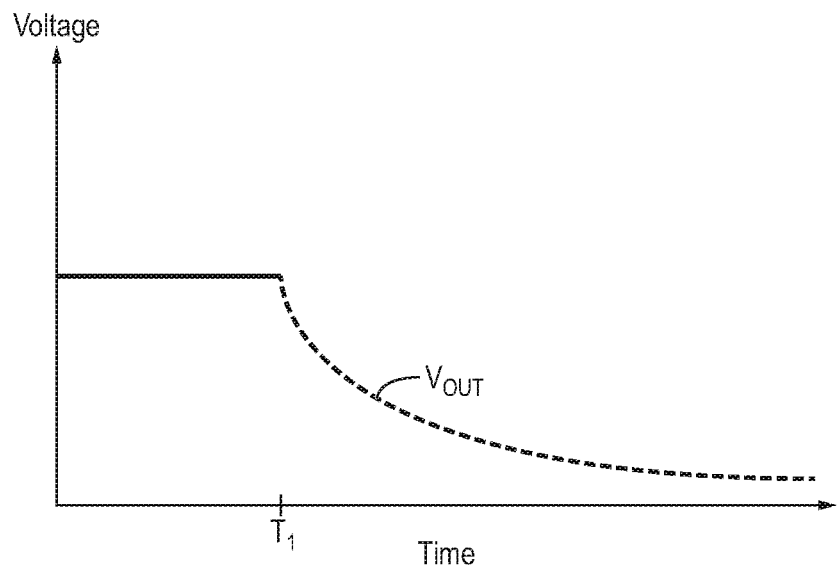
FIG. 3 shows a transient voltage signal $V_{out}$ supplied to by an analog simulation block to a digital simulation module, in accordance with one exemplary embodiment.

FIG. 3 shows a transient voltage signal $V_{out}$ supplied to by analog simulation block to the digital simulation module, in accordance with one exemplary embodiment. The voltage signal is shown as being constant until time $T_1$ at which point it is assumed that a supply voltage is turned off. In response, the voltage signal $V_{out}$ is seen to be decreasing in time. It is understood that if the same supply voltage is turned on, voltage $V_{out}$ increases with time.

Figure 4:
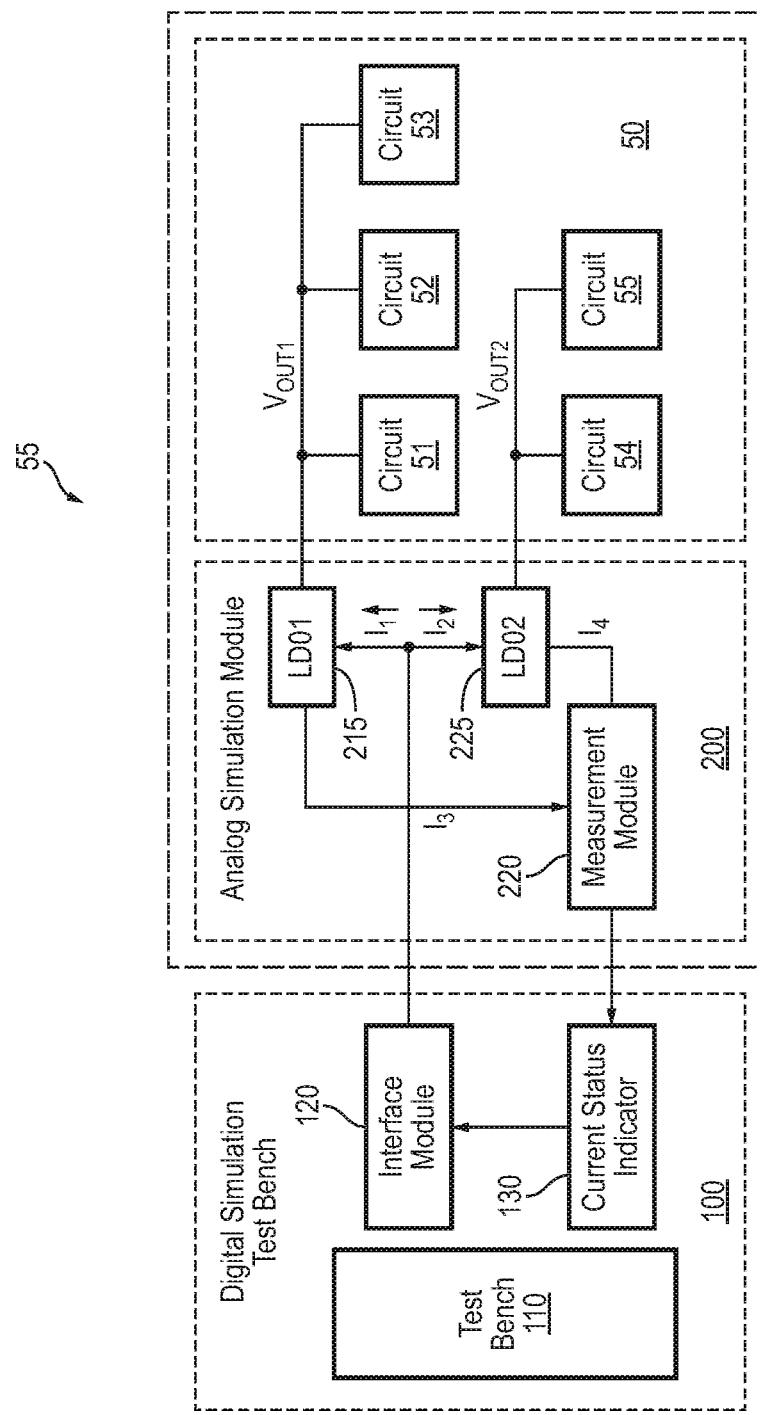
FIG. 4 is a simplified high-level bock diagram of a mixed-mode circuit design simulator, in accordance with another embodiment of the present invention.

FIG. 4 is a simplified high-level bock diagram of a mixed-mode circuit design simulator 55, in accordance with another embodiment of the present invention. Simulator 55 is shown as including, in part, a digital simulation module 50, a digital simulation test bench 100, and an analog simulation module 200. Digital simulation test bench 100 is shown as including, in part, a test bench 110, an interface module 120, and a current status indicator 130. Analog simulation module 200 which in this exemplary embodiment is shown as performing analog simulation on analog circuit blocks low-drop out voltage (LDO) circuits 215 and 225, is shown as including, in part, current measurement module 220. Digital simulation module 50 is shown as performing digital simulation on digital circuit blocks 51, 52, 53, 54 and 55 in this exemplary embodiment.

Test bench stimulus 110 applies a test vector to interface module 120. In response interface module 120 supplies a current signal $I_1$ to LDO circuit 215 and current signal $I_2$ to LDO circuit 225. It is understood that currents $I_1$ and $I_2$ may or may not be equal.

When simulating events that cause a change in the voltage level supplied to various circuit blocks of a design (e.g., power-up or power-down operations), each of current signals $I_1$ and $I_2$ has a transient behavior and thus has different values at different times. Accordingly, to simulate such events, interface module 120 provides a multitude of current signal values at different simulation times for each of current signals $I_1$ and $I_2$.

Measurement module 220 is adapted to measure the currents $I_3$ and $I_4$ flowing in LDO circuits 215 and 225 in response to the transient current signals $I_1$ and $I_2$ supplied by interface module 120 and deliver the measured currents $I_3$ and $I_4$ to current status indicator 130 via interface module 120. If current signal $I_3$ is detected as exceeding a threshold value, signal ST, supplied by current status indicator 130 to interface module 120, causes interface module 120 to change the values of current $I_1$. This process is repeated until current $I_3$ is detected to be equal to or less than the threshold value. Similarly, if current signal $I_4$ is detected as exceeding a threshold value, signal ST, supplied by current status indicator 130 to interface module 120, causes interface module 120 to change the values of current $I_2$. This process is repeated until current $I_4$ is detected to be equal to or less than the threshold value.

Analog simulation module 200 is also shown as supplying voltage $V_{OUT1}$ to digital circuit blocks 51, 52 and 53, and voltage $V_{OUT2}$ to digital circuit blocks 54 and 55. In accordance with embodiments of the present invention, supply voltages $V_{OUT1}$ and $V_{OUT2}$ have substantially improved timing characteristics and transient behaviors that mimic the behavior of actual fabricated circuits.

Although in FIG. 4 LDO circuit 215 is shown as supplying the same time-varying voltage $V_{OUT1}$ to circuits 51, 52 and 53 in response to turning on or turning off of a supply voltage, it is understood that in other embodiments, LDO 215 may supply the same or different time-varying voltages to any number of circuits. Furthermore, although in FIG. 4 LDO circuit 225 is shown as supplying the same time-varying voltage $V_{OUT2}$ to circuits 54 and 55 in response to turning on or turning off of a supply voltage, it is understood that in other embodiments, LDO 225 may supply the same or different time-varying voltages to any number of circuits.

In one embodiment, LDOs 215 and 225 form a power management unit (PMU) formed within a larger system-on-chip (SoC) integrated circuit. In one embodiment, the SoC operates in multiple operational modes each involving a different PMU current load. In operation, the current load dynamically fluctuates due to the different operational modes. In simulation, the current load is controlled during a power up cycle and a power down cycle.

A PMU netlist utilized for simulation of a circuit design may include external capacitance on some of the supply power lines from the PMU. With zero current loads added to the PMU, the external capacitance will not discharge during the power down cycle, as this may indicate incorrect behavior. With excessive current loads, the discharge of the external capacitance may occur too rapidly. With insufficient current loads, the discharge may occur too slowly. These effects may adversely impact digital timing.

One approach to this challenge is to add a constant current source to the PMU netlist. This approach may succeed, but because the current load is constant during the simulation, the power down cycle timing may not be accurate.

An example of a circuit that is sensitive to the power down cycle and power up cycle simulation challenges that are overcome by the embodiments of the present invention is an EFLASH circuit. To protect the EFLASH circuit, there are specified power down cycle signals from the PMU to the EFLASH circuit that are triggered when an output of the LDO circuits reaches a certain threshold value. If the timing of these signals, together with the power supply lines does not meet the anticipated timing constraints of the EFLASH circuit assertions, the test will fail.

A task (e.g., snps_inject_current( )) may be invoked to successfully simulate a power up cycle and power down cycle (as controlled by test bench 110) of the PMU with the correct timing. The current is injected from the test bench using trigger signals from the sequence, or other digital signals.

The LDO circuits include low impedance ports. In order not to load the LDO circuits, the current source may be required to have high impedance. Specifically, the decay rate of voltage supply signals $V_{OUT1}$ and $V_{OUT2}$ after shutdown should be such that timing delays on the load are accurate. Having a decay rate that is too fast or too slow may cause incorrect behavior.

Figure 5:
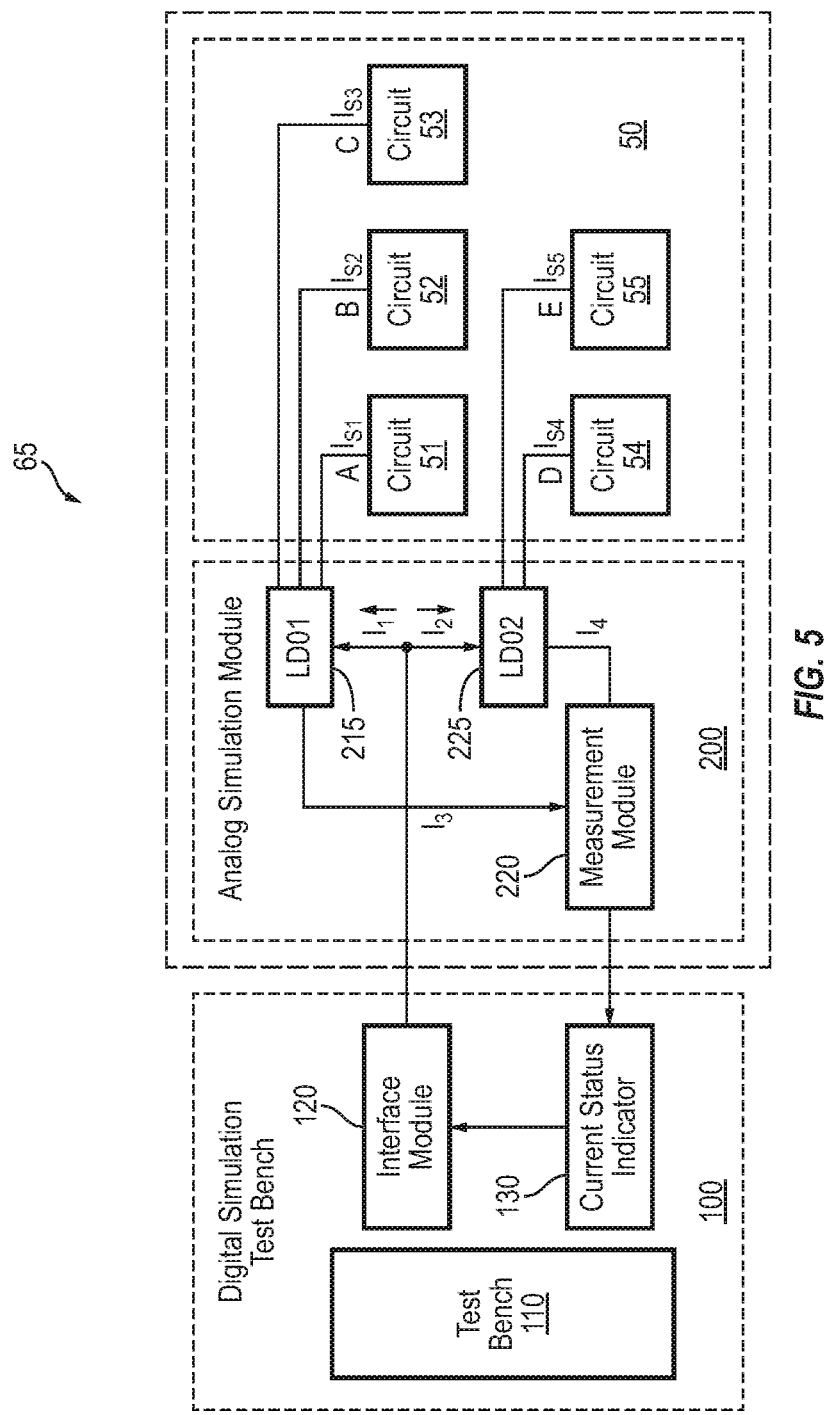
FIG. 5 is a simplified high-level bock diagram of a mixed-mode circuit design simulator, in accordance with another embodiment of the present invention.

FIG. 5 is a simplified high-level bock diagram of a mixed-mode circuit design simulator 65, in accordance with another embodiment of the present invention. The embodiment shown in FIG. 5 is similar to that shown FIG. 4, except that in the embodiment shown in FIG. 5, LDO 215 supplies three different supply voltages $V_{s1}$, $V_{s2}$, and $V_{s3}$ respectively to circuits 51, 52, 53, and LDO 225 supplies two different supply voltages $V_{s4}$, $V_{s5}$, respectively to circuits 54 and 55. In accordance with the embodiment shown in FIG. 5, the current supplied by the LDOs as directed by digital simulation test bench 100 accounts for current loading characteristics of devices or circuits 51, 52, 53, 54, 55 during power-down or power-up operation. The following description of the embodiments is provided with reference to power-down operations. It is understood, however, that such embodiments are equally applicable to power-up operations.

To achieve mixed-mode verification, in accordance with some embodiments, the transient current loading effect of each of the devices or circuits 51, 52, 53, 54, 55 that are powered by the PMU (i.e., LDOs 215 and 225) during the power-down (or power-up) phase is first determined. For example, assume that the device 51 is expected to receive a current $I_s$ during the power-up phase as defined by the following:

$I_s$=10 ma at t=0 nsec
$I_s$ starts to transition to 20 ma at t=20 nsec
$I_s$ starts to transition to 30 ma at t=25 nsec Next, a polynomial function that closely fits the above data is determined. In one embodiment, the polynomial function is of the first degree and thus is a linear function represented by y=mx+b. In yet other embodiments, a non-polynomial function may be used to define the transient current consumption of each device.

Accordingly, a function (such as a linear function) representative of the transient current consumption characteristics of each device powered by the PMU is determined. Consequently, during a power-down (or power-up operation), device 51 receives a current from LDO 215 that is defined by a function adapted to fit to the transient current consumption characteristic of device 51, as described above. Likewise, for example, device 55 receives a current from LDO 225 that is defined by a function adapted to fit to the transient current consumption characteristic of device 55, as described above. Nodes A, B and C may have the same voltage despite supplying different currents. Similarly, nodes E and F may have the same voltage despite supplying different currents.

Figure 6:
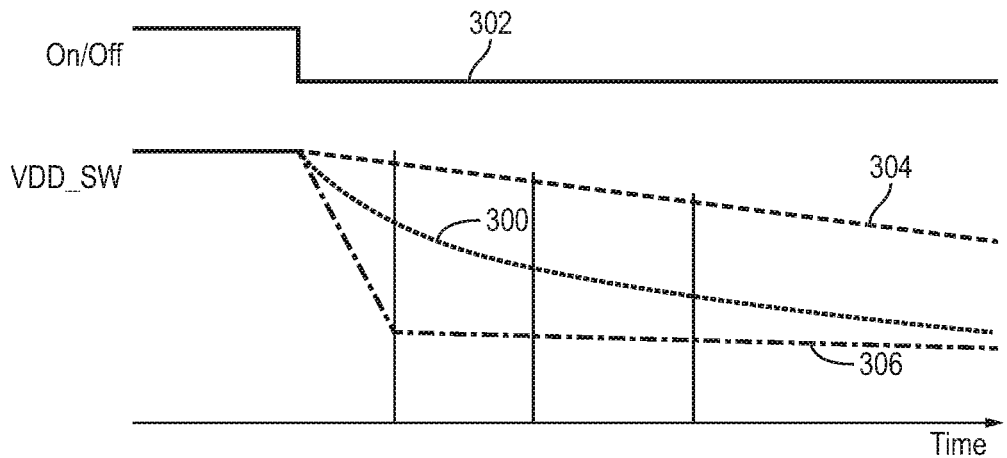
FIG. 6 shows, in part, a plot of time-varying supply voltage signals, in accordance with one embodiment.

Plot 300 of FIG. 6 illustrates the decay rate of voltage at, for example, node A of FIG. 5 in response to a power-down operation shown in signal 302 of FIG. 6. Plot 304 shows a decay rate that is too slow as obtained by conventional mixed-mode circuit simulators. Plot 306 shows a decay rate that is too fast as is also obtained by conventional mixed-mode circuit simulators. Plot 300 is obtained, as described above, by inject an accurate current load at a specified current signal timing to the analog simulator. The digital simulator may drive the current load. In one embodiment, a PLI that enables this functionality utilizes a SPICE node, current level value, and a current signal rise time (current rate of change) that corresponds to the target slope 300. In one embodiment the syntax of the PLI is:

snps_inject_current (<SPICE node>, <current level value>, <rise time>)

The below code snippet represents the expected behavior in one embodiment:

$snps_inject_current(top.i1.n1, 10.0e-3, 5.0e-9);
5 $snps_inject_current(top.i1.n1, 20.0e-3, 5.0e-9);
5 $snps_inject_current(top.i1.n1, 30.0e-3, 5.0e-9);

The current load commences at 10 mA. At 20 ns, it starts to transition to 20 mA. It takes 5 ns to arrive and it then starts a second transition to 30 mA with a rise time of 5 ns. Such a usage fits with the expectation of a y=mx+b equation to have a legal slope of m values.

To preserve overall the power consumption, portions of the circuit design are subject to a power down cycle when not in use. Even when off, such circuit portions draw an amount of leakage current. The leakage current is measured and compared to design limits for the circuit design. In prior approaches, the measure of leakage current is carried out in the SPICE netlist. In accordance with the embodiments of present invention, however, the measure of leakage current is moved to the digital simulator and/or analog simulator, as described above. When implemented for example in SystemVerilog, the measure of leakage current is available in a language familiar to the verification engineer, as opposed to a SPICE measurement call. Measure of the leakage current by the digital simulator or analog simulator also alleviates management of the SPICE file, as all calls are comprised by the simulators.

Measuring leakage current with the digital simulator enables detection of signals having current properties in an illegal region of the SoC during operation. The system monitors current properties of signals whose transgressions can have detrimental impact on the circuit design behavior. The final form of a measurement may resemble the below call of the PLI function:

$snps_get_port_current(<SPICE_Node>)

This implementation may be utilized to prevent signals from entering illegal states during simulation of the SoC in various scenarios.

Figure 7A:
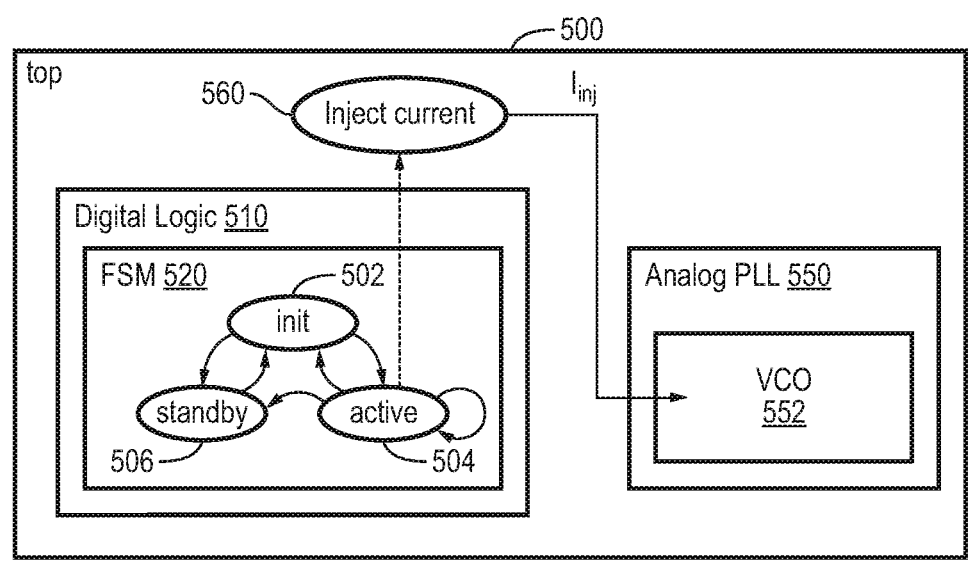
FIG. 7A is a simplified high-level block diagram of a mixed-mode circuit simulator, in accordance with one exemplary embodiment of the present invention.

FIG. 7A is a simplified high-level block diagram of a mixed-mode circuit simulator 500, in accordance with another exemplary embodiment of the present invention. Mixed mode simulator 500 is shown as including a digital simulator configured to simulate digital logic block 510, which in turn is shown as including, in part, a finite state machine (FCM) 520. State machine 520 is shown as having 3 exemplary states, namely initial (init) 502, active 504 and standby 506. Mixed mode simulator 500 is also shown as including an analog simulator 550 configured to simulate an analog PLL 550 having disposed therein a voltage-controlled oscillator (VCO) 552. Mixed mode simulator 500 is also shown as including an inject_current block 560 adapted to inject current to the VCO during the start-up phase of the VCO and when the state machine transitions to the active state. Inject_current block 560 may be part of a test bench applying test vector to the circuits being simulated. As is described further below, when FSM transitions to active sate 504, a current pulse is caused to be injected to VCO 552 via "inject current" block 50 thereby causing the VCO to oscillate.

Figure 7B:
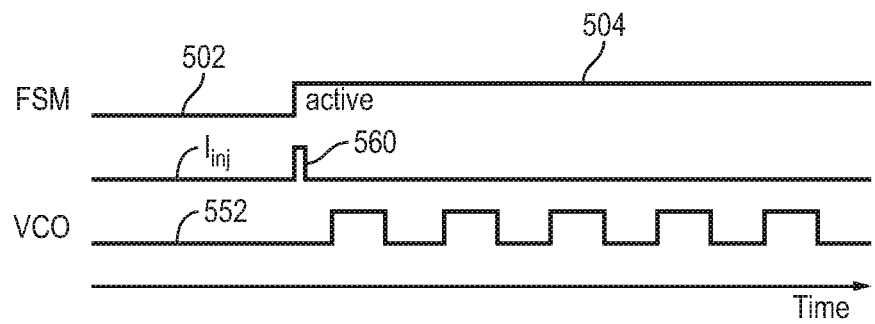
FIG. 7B is an exemplary timing diagram of a number of signals associated with the mixed-mode circuit design shown in FIG. 7A.

FIG. 7B is an exemplary timing diagram of a number of signals associated with the mixed-mode circuit design shown in FIG. 7A. As seen, when the state machine transitions from initial state 502 to active state 504, inject_current block injects a current pulse 560 to VCO block 552 thereby causing the VCO to oscillate.

Figure 8:
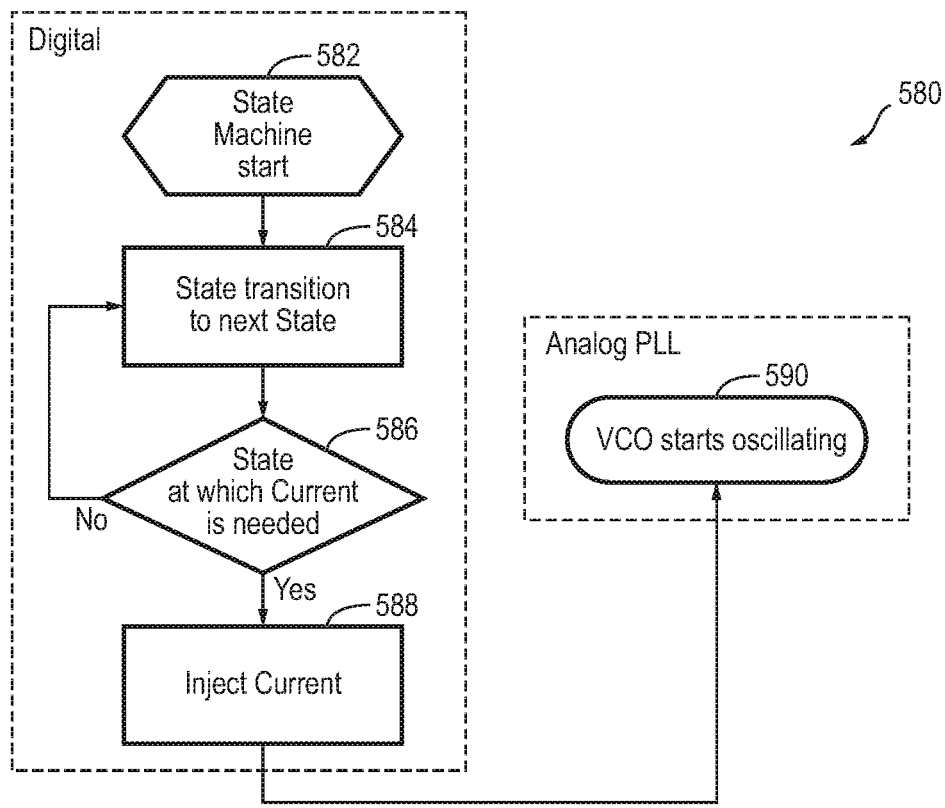
FIG. 8 is an exemplary flowchart for performing mixed-mode simulation involving a phase-locked loop having a VCO, in accordance with one exemplary embodiment of the present invention.

FIG. 8 is an exemplary flowchart 580 for performing mixed-mode simulation involving a phase-locked loop having a VCO, such as that shown in FIGS. 7A and 7B, in accordance with one embodiment of the present invention. The state machine starts at 582 and transitions to next state at 584. If at 586, it is determined that the state machine is at a predefined state (such as state an active state as shown in FIG. 7A) at 588 a current is injected to the VCO, thereby causing the VCO to oscillate at 590. If at 586, it is determined that the state machine is not at the predefined state, the state machine transition to next state 584.

Figure 9:
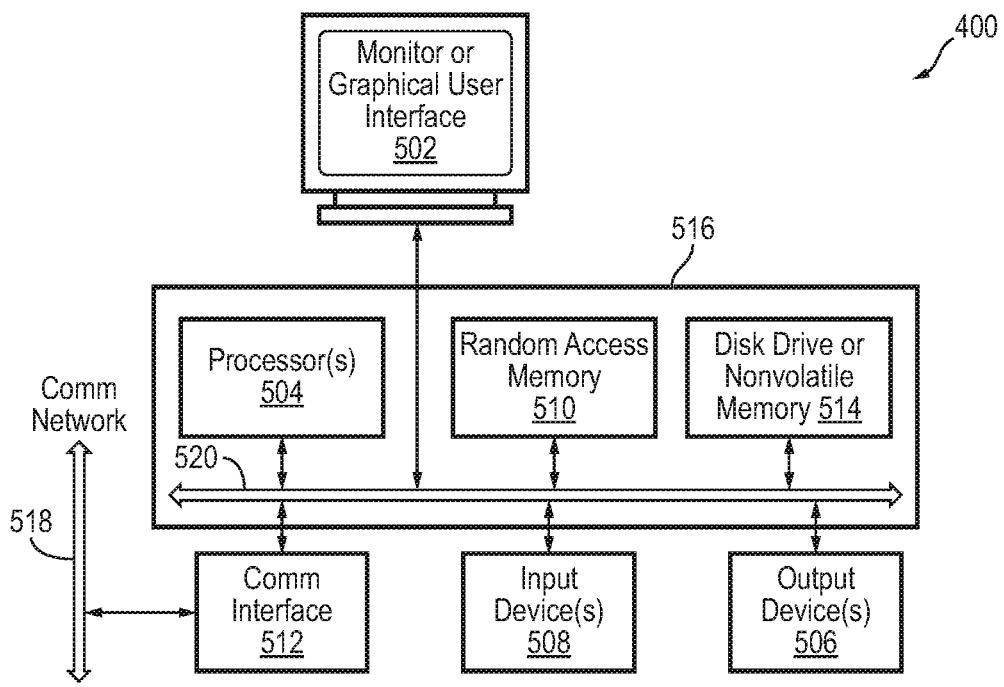
FIG. 9 is an exemplary block diagram of a computer system that may incorporate embodiments of the present invention.

FIG. 9 is an example block diagram of a computer system 400 that may incorporate embodiments of the present invention. FIG. 9 is merely illustrative of a machine system to carry out aspects of the technical processes described herein, and does not limit the scope of the claims. One of ordinary skill in the art would recognize other variations, modifications, and alternatives. In one embodiment, the computer system 400 typically includes a monitor or graphical user interface 502, a computer 516, a communication network interface 512, input device(s) 508, output device(s) 506, and the like.

As depicted in FIG. 9, computer 516 may include one or more processor(s) 505 that communicate with a number of peripheral devices via a bus subsystem 520. These peripheral devices may include input device(s) 508, output device(s) 506, communication network interface 512, and a storage subsystem, such as a random access memory 510 and a disk drive or nonvolatile memory 515.

The input device(s) 508 include devices and mechanisms for inputting information to the computer 516. These may include a keyboard, a keypad, a touch screen incorporated into the monitor or graphical user interface 502, audio input devices such as voice recognition systems, microphones, and other types of input devices. In various embodiments, the input device(s) 508 are typically embodied as a computer mouse, a trackball, a track pad, a joystick, wireless remote, drawing tablet, voice command system, eye tracking system, and the like. The input device(s) 508 typically allow a user to select objects, icons, text and the like that appear on the monitor or graphical user interface 502 via a command such as a click of a button or the like.

The output device(s) 506 include all possible types of devices and mechanisms for outputting information from the computer 516. These may include a display (e.g., monitor or graphical user interface 502), non-visual displays such as audio output devices, etc.

The communication network interface 512 provides an interface to communication networks (e.g., communication network 518) and devices external to the computer 516. The communication network interface 512 may serve as an interface for receiving data from and transmitting data to other systems. Embodiments of the communication network interface 512 typically include an Ethernet card, a modem (telephone, satellite, cable, ISDN), (asynchronous) digital subscriber line (DSL) unit, FireWire interface, USB interface, and the like. For example, the communication network interface 512 may be coupled to the communication network 518 via a FireWire bus, or the like. In other embodiments, the communication network interface 512 may be physically integrated on the motherboard of the computer 516, and may be a software program, such as soft DSL, or the like.

In various embodiments, the computer system 500 may also include software that enables communications over a network such as the HTTP, TCP/IP, RTP/RTSP protocols, and the like. In alternative embodiments, other communications software and transfer protocols may also be used, for example IPX, UDP or the like. In some embodiments, the computer 516 in the processor(s) 504 may include one or more microprocessors from Intel®. Further, one embodiment, the computer 1016 includes a UNIX-based operating system.

The random access memory 510 and the disk drive or nonvolatile memory 514 are examples of tangible media configured to store data and instructions to implement various embodiments of the processes described herein, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The random access memory 510 and the disk drive or nonvolatile memory 514 may be configured to store the basic programming and data constructs that provide the functionality of the disclosed processes and other embodiments thereof that fall within the scope of the present invention.

Software code modules and instructions that implement embodiments of the present invention may be stored in the random access memory 510 and/or the disk drive or nonvolatile memory 514. These software modules may be executed by the processor(s) 504. The random access memory 510 and the disk drive or nonvolatile memory 514 may also provide a repository for storing data used by the software modules.

The random access memory 510 and the disk drive or nonvolatile memory 514 may include a number of memories including a main random access memory (RAM) for storage of instructions and data during program execution and a read only memory (ROM) in which fixed non-transitory instructions are stored. The random access memory 510 and the disk drive or nonvolatile memory 514 may include a file storage subsystem providing persistent (nonvolatile) storage for program and data files. The random access memory 510 and the disk drive or nonvolatile memory 514 may include removable storage systems, such as removable flash memory.

The bus subsystem 520 provides a mechanism for letting the various components and subsystems of computer 516 communicate with each other as intended. Although the communication network interface 512 is depicted schematically as a single bus, alternative embodiments of the bus subsystem 520 may utilize multiple busses.

FIG. 7 is representative of a computer system capable of implementing embodiments of the present invention. It will be readily apparent to one of ordinary skill in the art that many other hardware and software configurations are suitable for use with embodiments of the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention may be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A computer-implemented method of testing a circuit design, the method comprising:
applying a test vector from a digital circuit simulator test bench stimulus to a digital simulation interface;
supplying a time varying first current signal from the digital simulation interface to an analog circuit simulator in response to the test vector the time-varying first current signal having a first value during a first point in time and a second value during a second point in time, the second value being different from the first value, the first point in time and the second point in time defining a first time interval, wherein the time-varying first current signal is representative of current loading characteristics of a first portion of the circuit design, wherein the first portion comprises digital circuits;
performing, by the analog circuit simulator, an analog simulation of a second portion of the circuit design using the time-varying first current signal;
measuring, by a measurement operation, a second current signal in response to the performed analog simulation of the circuit design;
supplying, by the measurement operation, the second current signal to a current status indicator via the digital simulation interface;
and causing the time-varying first current signal to change by the current status indicator, during a second time interval different from the first time interval, until the second current signal has a value that is equal to or less than a threshold value.

2. The method of claim 1, further comprising:
supplying a first time-varying voltage supply signal to a digital circuit simulator.

3. The method of claim 2, wherein the first time-varying voltage supply signal is supplied during a power-up or a power-down operation.

4. The method of claim 3, wherein the first time-varying voltage supply signal is supplied by a first low-drop-out voltage circuit.

5. The method of claim 2, further comprising supplying a second time-varying voltage supply signal to the digital circuit simulator in response to the time-varying first current signal and using a first low-drop-out voltage circuit.

6. A computer system configured to test a circuit design, the computer system comprising:
a memory storing instructions;
and a processor, coupled with the memory and to execute the instructions, the instructions when executed cause the processor to:
apply a test vector from a digital circuit simulator test bench stimulus to a digital simulation interface;
supply a time varying first current signal from the digital simulation interface to an analog circuit simulator in response to the test vector, the time-varying first current signal having a first value during a first point in time and a second value during a second point in time, the second value being different from the first value, the first point in time and the second point in time defining a first time interval, wherein the time-varying first current signal is representative of current loading characteristics of a first portion of the circuit design, wherein the first portion comprises digital circuits;
perform, by the analog circuit simulator, an analog simulation of a second portion of the circuit design using the time-varying first current signal;
measure, by a measurement operation, a second current in response to the performed analog simulation of the circuit design;

supply, by the measurement operation, the second current signal to a current status indicator via the digital simulation interface;

and cause the time-varying first current signal to change by the current status indicator, during a second time interval different from the first time interval, until the second current signal has a value that is equal to or less than a threshold value.

7. The computer system of claim 6, wherein the computer system is further configured to:
supply a first time-varying voltage supply signal to a digital simulator.

8. The computer system of claim 7, wherein the first time-varying voltage supply signal is supplied during a power-up or a power-down operation.

9. The computer system of claim 8, wherein the first time-varying voltage supply signal is supplied by a first low-drop-out voltage circuit.

10. The computer system of claim 7, wherein the computer system is further configured to supply a second time-varying voltage supply signal to the digital simulator in response to the time-varying first current signal and using a first low-drop-out voltage circuit.

\* \* \* \* \*